United States Patent
He et al.

(10) Patent No.: US 12,020,752 B2
(45) Date of Patent: Jun. 25, 2024

(54) DISCHARGE CIRCUITS FOR ERASING NAND FLASH MEMORY

(71) Applicant: Yangtze Memory Technologies Co., Ltd., Hubei (CN)

(72) Inventors: Weiwei He, Hubei (CN); Liang Qiao, Hubei (CN); Mingxian Lei, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 97 days.

(21) Appl. No.: 17/847,657

(22) Filed: Jun. 23, 2022

(65) Prior Publication Data

US 2023/0268008 A1 Aug. 24, 2023

Related U.S. Application Data

(63) Continuation of application No. PCT/CN2022/076858, filed on Feb. 18, 2022.

(51) Int. Cl.
*G11C 7/10* (2006.01)
*G11C 7/08* (2006.01)
(Continued)

(52) U.S. Cl.
CPC ............. *G11C 16/16* (2013.01); *G11C 7/08* (2013.01); *G11C 16/0433* (2013.01); *G11C 16/26* (2013.01); *H03K 19/01742* (2013.01)

(58) Field of Classification Search
CPC .................................................. G11C 7/1006
See application file for complete search history.

(56) References Cited

U.S. PATENT DOCUMENTS

| 6,111,786 | A | 8/2000 | Nakamura |
| 7,035,143 | B2 | 4/2006 | Lee |

(Continued)

FOREIGN PATENT DOCUMENTS

| CN | 105009219 A | 10/2015 |
| JP | 2009-230777 A | 10/2009 |

(Continued)

OTHER PUBLICATIONS

Wikipedia Article—"Current source," retrieve on May 25, 2021 from: https://en.wikipedia.org/w/index.php?title-Current_source &oldid=574969544; 11 pages.

(Continued)

*Primary Examiner* — Jason Lappas
(74) *Attorney, Agent, or Firm* — Sterne, Kessler, Goldstein & Fox P.L.L.C.

(57) ABSTRACT

The present disclosure provides a method for discharging a memory device after an erase operation. The method comprises grounding a source line of the memory device; and switching on a discharge transistor to connect a bit line of the memory device to the source line by maintaining a constant voltage difference between a gate terminal of the discharge transistor and the source line. The method also includes comparing an electrical potential of the source line with a first predetermined value; and floating the gate terminal of the discharge transistor when the electrical potential of the source line is lower than the first predetermined value.

20 Claims, 13 Drawing Sheets

(51) Int. Cl.
*G11C 16/04* (2006.01)
*G11C 16/16* (2006.01)
*G11C 16/26* (2006.01)
*H03K 19/017* (2006.01)

(56) References Cited

U.S. PATENT DOCUMENTS

| | | | |
|---|---|---|---|
| 7,929,344 | B2 | 4/2011 | Maejima |
| 8,644,079 | B2 | 2/2014 | Passerini et al. |
| 11,763,890 | B2 | 9/2023 | Shimizu et al. |
| 2008/0084747 | A1* | 4/2008 | Hemink .............. G11C 11/5628 365/189.11 |
| 2008/0123434 | A1 | 5/2008 | Kuriyama et al. |
| 2014/0043907 | A1 | 2/2014 | Fujimura |
| 2015/0348621 | A1 | 12/2015 | Sako |
| 2017/0092362 | A1 | 3/2017 | Takekida |

FOREIGN PATENT DOCUMENTS

| | | |
|---|---|---|
| JP | 2019-197603 A | 11/2019 |
| TW | I264727 B | 10/2006 |

OTHER PUBLICATIONS

International Search Report directed to related International Patent Application No. PCT/CN2022/076858, dated Nov. 17, 2022, 5 pages.

Taiwanese Office Action directed to Taiwanese Patent Application No. 111149984, mailed Feb. 21, 2024; 14 pages.

Japanese Notice of Reasons for Refusal directed to Japanese Patent Application No. 2022-578908, mailed Mar. 18, 2024; 6 pages.

* cited by examiner

DISCHARGE CIRCUITS FOR ERASING NAND FLASH MEMORY

INCORPORATION BY REFERENCE

This application claims priority to International Patent Application No. PCT/CN2022/076858 filed on Feb. 18, 2022, which is incorporated herein by reference in its entirety.

TECHNICAL FIELD

The present disclosure generally relates to the field of semiconductor technology, and more particularly, to a discharge circuit for a NAND flash memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, a memory array can include a plurality of memory strings vertically arranged on a substrate, each memory string having a plurality of memory cells that are vertically stacked. As such, storage density per unit area can be greatly increased.

While programming and reading operations can be performed for all the memory cells that share a word line in a memory page, an erase operation is usually performed for all the memory cells in a memory block that share a common source line. During the erase operation, an erase voltage (about 20 V) can be applied to the common source line or an n-well in the substrate, while word lines can be grounded. Electrical potentials of the channel layers in the memory strings can be raised gradually from bottom to top.

With the increase of the number of vertically stacked memory cells, the erase voltage can also be applied to the bit lines at top of the memory strings to improve erase speed. Additionally, gate-induced-drain-leakage (GIDL) current can be introduced to assist the erase operation such that the electrical potential of the channel layers in the memory strings can quickly reach the erase voltage. After an erase operation, the GIDL current needs to be removed and high electrical potentials of the common source line and the bit lines need to be discharged. Although discharging can be performed through a discharge transistor connected between the common source line and a corresponding bit line, timing of a discharge operation is critical.

BRIEF SUMMARY

Embodiments of a discharge circuit and a method for discharging a NAND flash memory are described in the present disclosure.

One aspect of the present disclosure provides a discharge circuit for discharging a memory device after an erase operation. The discharge circuit includes a discharge transistor, connecting a bit line and a source line of the memory device. The discharge circuit also includes a source line detect circuit, connected to the source line and configured to compare an electrical potential of the source line with a predetermined value. The discharge circuit further includes a gate discharge circuit, configured to maintain a constant voltage difference between the discharge transistor and the source line, wherein the constant voltage difference applied to the discharge transistor and the source line switches on the discharge transistor.

In some embodiments, the discharge transistor is a metal-oxide-semiconductor field-effect-transistor (MOSFET). A gate terminal of the MOSFET is connected to the gate discharge circuit. A source terminal of the MOSFET is connected to the source line and a drain terminal of the MOSFET connected to the bit line.

In some embodiments, the gate discharge circuit includes a set of diodes connected in series.

In some embodiments, the gate discharge circuit further includes a switching transistor connected in series with the set of diodes.

In some embodiments, the gate discharge circuit further includes a voltage level shifter configured to provide a switching voltage to switch on the switching transistor.

In some embodiments, the set of diodes comprise a MOSFET configured as an effective diode, wherein a gate terminal of the MOSFET is connected to a drain terminal of the MOSFET. In some embodiments, the MOSFET is a p-channel MOSFET.

In some embodiments, the source line detect circuit includes an operational amplifier, a resistive voltage divider, and a capacitor connected in parallel with the resistive voltage divider. First ends of the capacitor and the resistive voltage divider are connected. Second ends of the capacitor and the resistive voltage dividers are grounded.

In some embodiments, the source line detect circuit also includes a pull-up transistor connecting the first ends of the capacitor and the resistive voltage divider to a power supply. The pull-up transistor is controlled by an output of the operational amplifier.

In some embodiments, the resistive voltage divider includes a first resistor connected in series with a second resistor. The second resistor has an adjustable resistance.

In some embodiments, the operational amplifier is configured to set the predetermined value through an electrical potential of the first ends of the capacitor and the resistive voltage divider. A negative input of the operational amplifier is connected to a reference voltage, and a positive input of the operational amplifier is connected to an intermediate point of the resistive voltage divider.

In some embodiments, the operational amplifier is configured to compare the electrical potential of the source line with the predetermined value. A negative input of the operational amplifier is connected to the source line, and a positive input of the operational amplifier is connected to the first ends of the capacitor and the resistive voltage divider.

In some embodiments, the source line is grounded.

In some embodiments, the discharge circuit further includes a current source configured to regulate a discharge current flowing through the source line.

Another aspect of the present disclosure provides a method for discharging a memory device after an erase operation. The method comprises grounding a source line of the memory device; and switching on a discharge transistor to connect a bit line of the memory device to the source line by maintaining a constant voltage difference between a gate terminal of the discharge transistor and the source line. The method also includes comparing an electrical potential of the source line with a first predetermined value; and floating the gate terminal of the discharge transistor when the electrical potential of the source line is lower than the first predetermined value.

In some embodiments, the method also includes comparing the electrical potential of the source line with a second predetermined value, wherein the second predetermined value is smaller than the first predetermined value.

In some embodiments, the method further includes grounding the gate terminal of the discharge transistor when the electrical potential of the source line is lower than the second predetermined value.

In some embodiments, the method also includes regulating, by a current source, a discharge current flowing through the source line.

In some embodiments, the method further includes setting the first predetermined value smaller than a source/drain junction breakdown voltage of the discharging transistor.

Yet another aspect of the present disclosure provides a memory device having a memory block and a peripheral circuit. The memory block includes a plurality of memory strings connected to a source line and a plurality of bit lines. The peripheral circuit includes a discharge circuit configured to discharge the memory block after an erase operation. The discharge circuit includes a plurality of discharge transistors. Each discharge transistor is configured to connect the source line to a corresponding bit line. The discharge circuit also includes a source line detect circuit connected to the source line and configured to compare an electrical potential of the source line with a predetermined value. The discharge circuit further includes a gate discharge circuit, configured to maintain a constant voltage difference between gate terminals of the plurality of discharge transistors and the source line.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
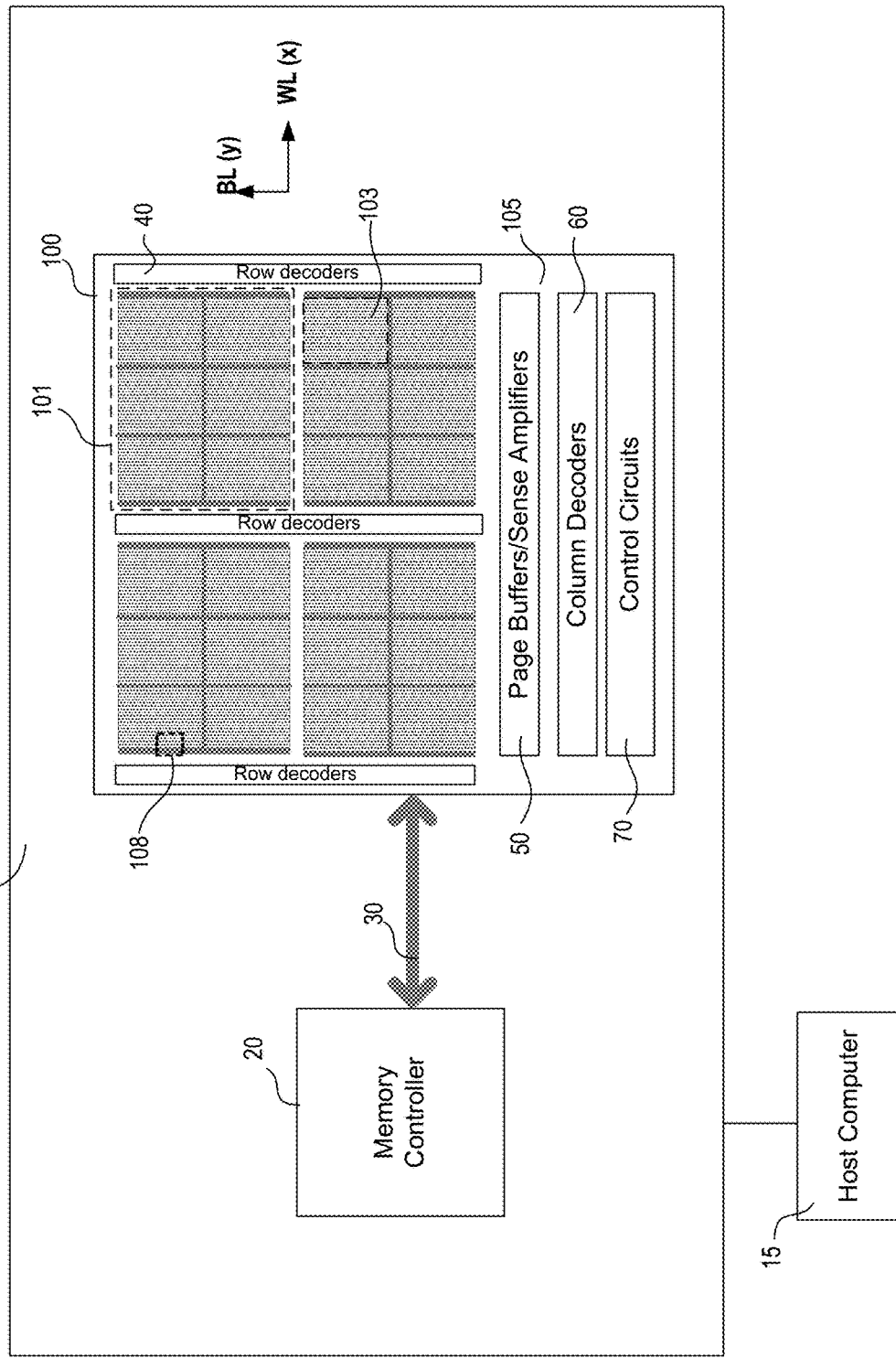
FIGS. 1A-1C illustrate a memory system with a NAND flash memory, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within.

FIG. 1A illustrates a block diagram of an exemplary system S1 having a memory system 10, according to some embodiments of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The memory system 10 (also referred to as a NAND memory system) includes a NAND flash memory 100 and a host controller 20 (also referred to as a memory controller). The memory system 10 can communicate with a host computer 15 through the memory controller 20, where the memory controller 20 can be connected to the NAND flash memory 100 via a memory channel 30. In some embodiments, the memory system 10 can have more than one NAND flash memory 100, while each NAND flash memory 100 can be managed by the memory controller 20.

In some embodiments, the host computer 15 can include a processor of an electronic device, such as a central processing unit (CPU), or a system-on-chip (SoC), such as an application processor (AP). The host computer 15 sends data to be stored at the NAND memory system or memory system 10 or retrieves data by reading the memory system 10.

The memory controller 20 can handle I/O requests received from the host computer 15, ensure data integrity and efficient storage, and manage the NAND flash memory 100. The memory channel 30 can provide data and control communication between the memory controller 20 and the NAND flash memory 100 via a data bus.

Figure 1B:
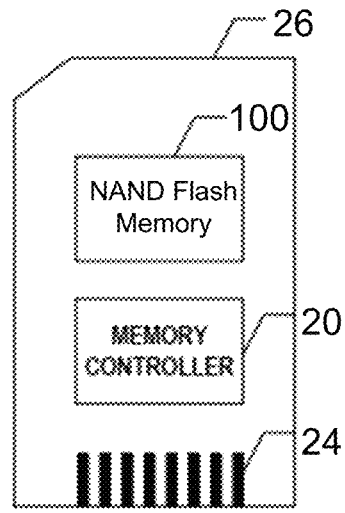
Figure 1C:
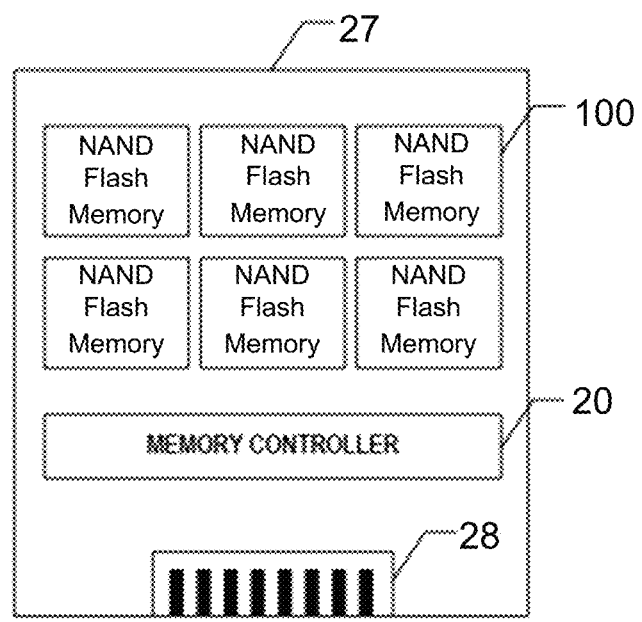

Memory controller 20 and one or more NAND flash memory 100 can be integrated into various types of storage devices, for example, be included in the same package, such as a universal Flash storage (UFS) package or an eMMC package. That is, memory system 10 can be implemented and packaged into different types of end electronic products. In one example as shown in FIG. 1B, memory controller 20 and a single NAND flash memory 100 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 16). In another example as shown in FIG. 1C, memory controller 20 and multiple NAND flash memories 100 can be integrated into a solid state drive (SSD) 27. SSD 27 can further include an SSD connector 28 coupling SSD 27 with a host (e.g., the host computer 15 in FIG. 1A).

Referring to FIG. 1A, the NAND flash memory 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1A, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" respectively in FIG. 1A. In this disclosure, one or more memory block 103 can also be referred to as the "memory array" or "array." The memory array is the core area in a memory device, performing storage functions.

The NAND flash memory 100 also includes a peripheral circuit region 105, an area surrounding memory planes 101. The peripheral circuit region 105, also named as peripheral circuits, contains many digital, analog, and/or mixed-signal circuits to support functions of the memory array, for example, page buffers/sense amplifiers 50, row decoders/word line drivers 40, column decoders/bit line drivers 60, and control circuits 70. Control circuits 70 include register, active and/or passive semiconductor devices, such as transistors, diodes, capacitors, resistors, etc., as would be apparent to a person of ordinary skill in the art. The control circuits 70 of the peripheral circuit region 105 can be configured to initiate a program operation on a select memory cell of a NAND memory string in the memory block 103. In some implementations, the control circuits 70 receives a program command from a memory controller (e.g., memory controller 20) through interface, and in response, sends control signals to at least row decoder/word line driver, column decoder/bit line driver, and voltage generator deposed in the peripheral circuit region 105 to initiate the program operation on the select memory cell.

It is noted that the layout of the electronic components in the memory system 10 and the NAND flash memory 100 in FIG. 1A are shown as an example. The memory system 10 and the NAND flash memory 100 can have other layout and can include additional components. For example. The NAND flash memory 100 can also have high-voltage charge pumps, I/O circuits, etc. The memory system 10 can also include firmware, data scrambler, etc. In some embodiments, the peripheral circuit region 105 and the memory array can be formed independently on separate wafers and then connected with each other through wafer bonding.

Figure 2A:
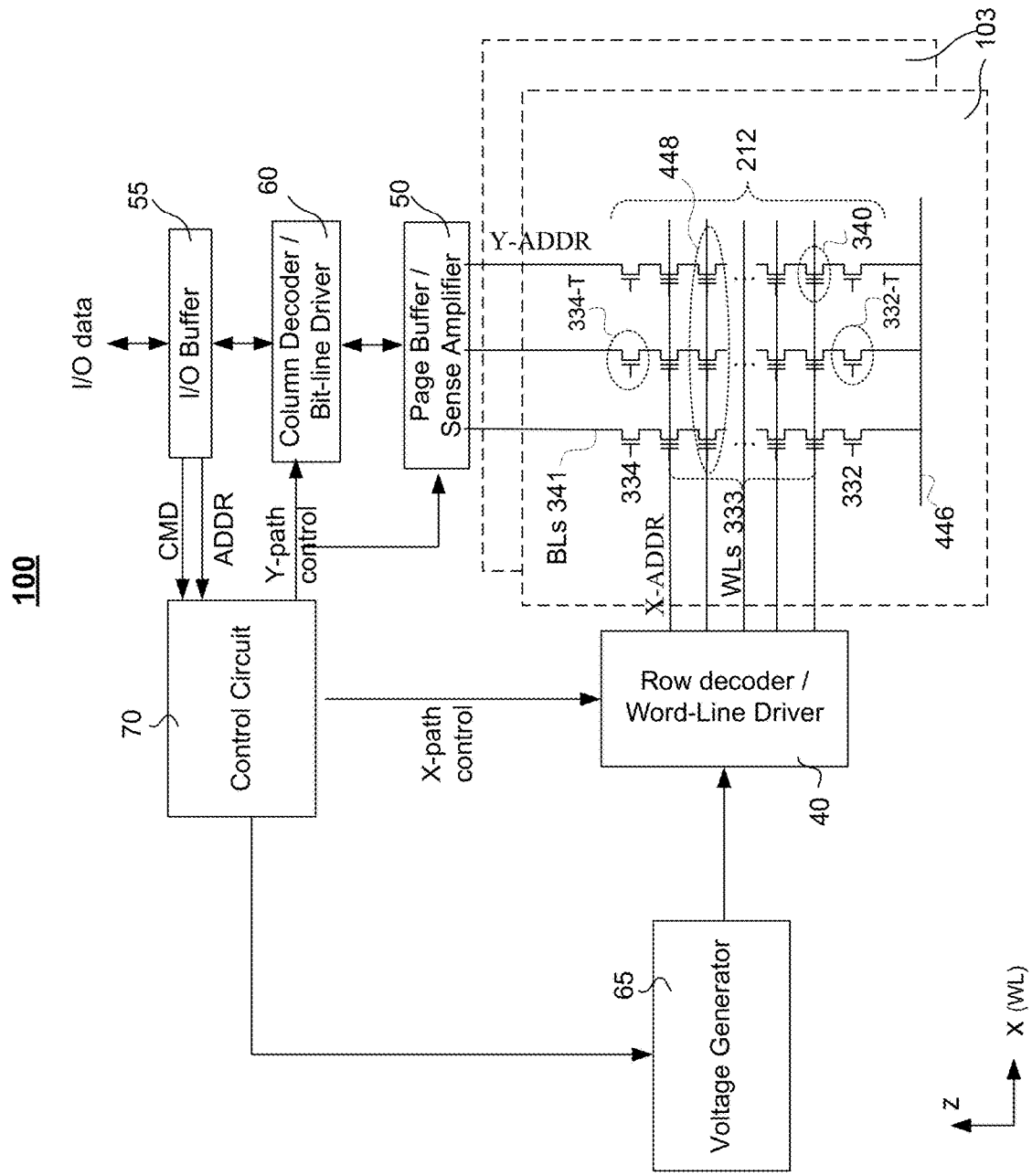
FIG. 2A shows a schematic circuit diagram of a NAND flash memory, according to some embodiments of the present disclosure.

FIG. 2A shows a schematic diagram of the NAND flash memory 100, according to some embodiments of the present disclosure. The NAND flash memory 100 includes one or more memory blocks 103. Each memory block 103 includes memory strings 212. Each memory string 212 includes memory cells 340. The memory cells 340 sharing the same word line forms a memory page 448. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 446. The ACS 446 can be shared by the memory strings 212 in an entire memory block, and is also referred to as the common source line.

The NAND flash memory 100 can also include a peripheral circuit that includes many digital, analog, and/or mixed-signal circuits to support functions of the memory block 103, for example, a page buffer/sense amplifier 50, a row decoder/word line driver 40, a column decoder/bit line driver 60, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art. In some embodiments, the peripheral circuit can support an erase operation assisted by a gate-induced drain leakage (GIDL) current.

The memory blocks 103 can be coupled with the row decoder/word line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the NAND flash memory 100 in response to an X-path control signal provided by the control circuit 70. The row decoder/word line driver 40 can transfer voltages provided from the voltage generator 65 to the word lines according to the X-path control signal. During the read and programming operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 60 can transfer an inhibit voltage $V_{inhibit}$ to an unselected bit line and connect a selected bit line to ground according to a Y-path control signal received from the control circuit 70. In the other words, the column decoder/bit line driver 60 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 448. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1A) and the NAND flash memory 100.

The control circuit 70 can control the page buffer/sense amplifier 50 and the row decoder/word line driver 40 in response to the commands CMD transferred by the input/output buffer 55. During the programming operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index, a block index and a plane index to identify the memory page 448, memory block 103, and memory plane 101 (in FIG. 1A), respectively. The column address Y-ADDR can identify a byte or a word in the data of the memory page 448.

In some implementations, the control circuit 70 can include one or more control logic unit. Each control logic unit described herein can be either a software module and/or a firmware module running on a processor, such as a microcontroller unit (MCU), which is part of control circuits 70, or a hardware module of a finite-state machine (FSM), such as an integrated circuit (IC, e.g., application-specific IC (ASIC), field-programmable gate array (FPGA), etc.), or a combination of software module, firmware module, and hardware module.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In some embodiments, the NAND flash memory 100 can be formed based on the floating gate technology. In some embodiments, the NAND flash memory 100 can be formed based on charge trapping technology. The NAND flash memory based on charge trapping can provide high storage density and high intrinsic reliability. Storage data or logic states (e.g., threshold voltage Vth of the memory cell 340) depends on the amount of charge trapped in a storage layer. In some embodiments, the NAND flash memory 100 can be a three-dimensional (3D) memory device, where the memory cells 340 can be vertically stacked on top of each other.

Figure 2B:
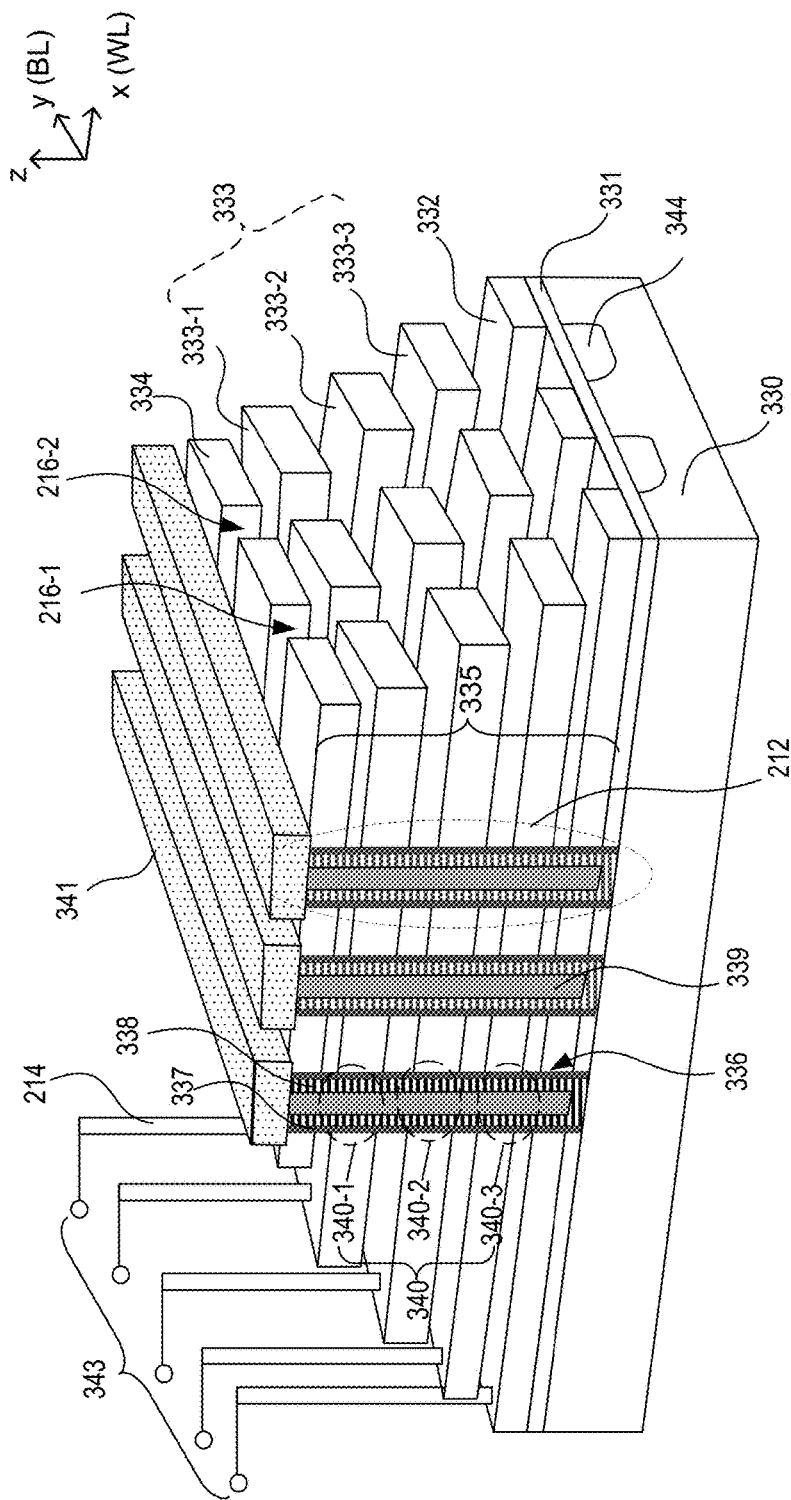
FIG. 2B illustrates a perspective view of a three-dimensional (3D) NAND flash memory, in accordance with some embodiments of the present disclosure.

FIG. 2B illustrates a perspective view of a portion of a 3D NAND flash memory 200, according to some embodiments of the present disclosure. The 3D NAND flash memory 200 includes a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 2B for clarity.

The control gates of each tier are separated by slit structures 216-1 and 216-2 through the film stack 335. The 3D NAND flash memory 200 also includes a tier of top select gates (TSGs) 334 over the stack of control gates 333. The stack of TSG 334, control gates 333 and BSG 332 is also referred to as "gate electrodes". The 3D NAND flash memory 200 further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The 3D NAND flash memory 200 further includes bit lines (BLs) 341 connected with the memory strings 212 over the TSGs 334. The 3D NAND flash memory 200 also includes metal interconnect lines 343 connected with the gate electrodes through contact structures 214. The edge of the film stack 335 is configured in a shape of staircase to allow an electrical connection to each tier of the gate electrodes.

In FIG. 2B, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The 3D NAND flash memory 200 can also include other structures, for example, TSG cut, common source contact, array common source and dummy memory string. These structures are not shown in FIG. 2B for simplicity.

In a NAND flash memory, read and programming operations can be performed in a memory page 448, which includes all memory cells 340 sharing the same word line. In a NAND memory, the memory cell 340 can be in an erased state ER or a programmed state P1. To further increase storage density, a memory cell can store n-bit of data and have $2^n$ states, where n is a whole number. For example, n equals 1, 2, 3, and 4 for SLC, MLC, TLC and QLC mode, respectively.

During an erase operation, all memory cells 340 in the same memory block 103 can be reset to the erased state ER as logic "1" by implementing a negative voltage difference between the control gates 333 and source terminals of the memory cells (e.g., the array common source 446) such that all the trapped electronic charges in the storage layer of the memory cells 340 can be removed. For example, the negative voltage difference can be induced by setting the control gates 333 of the memory cells 340 to ground, and applying a high positive voltage to the array common source 446. In some embodiments, an incremental step pulse erase (ISPE) scheme can be used for the erase operation. In this example, a voltage pulse can be applied to the memory cells in an erase loop, where a magnitude of the voltage pulse, i.e., the erase voltage $V_{erase}$, can be increased incrementally by an erase step voltage $V_{step\_ers}$ in subsequent erase loops.

After the erase operation, an erase verification operation can be performed to determine if the memory cells are at the state ER, or if the erase operation is completed successfully. An erase verification voltage EV can be applied to the word lines of the memory cells to compare with the threshold voltages of the memory cells. If the erase verification voltage EV is higher than the threshold voltage of the memory cell, it can be determined that the memory cell is at the state ER. If all the memory cells in the memory block are at the state ER, it can be considered that the memory block passes the erase verification. If a predetermined number of memory cell are not at the state ER, it can be considered that the memory block fails the erase verification. The erase and erase verification operations can be performed for the memory cells again in a next erase loop, where the erase voltage $V_{erase}$ can be increased by the erase step voltage $V_{step\_ers}$.

To perform the erase operation, the erase voltage $V_{erase}$ can be applied to an n-well in the substrate that is shared by all the memory cells in the same memory block. In some embodiments, the erase voltage $V_{erase}$ can be applied to the ACS 446 as shown in FIG. 2A. In some embodiments, the NAND flash memory 100 can have a three-dimensional structure, for example, as the 3D NAND flash memory 2000 shown in FIG. 2B. In this example, the NAND flash memory can also include an additional transistor at each end of the memory string, where the additional transistor introduces gate-induced drain leakage (GIDL) to assist the erase operation.

Figure 3:
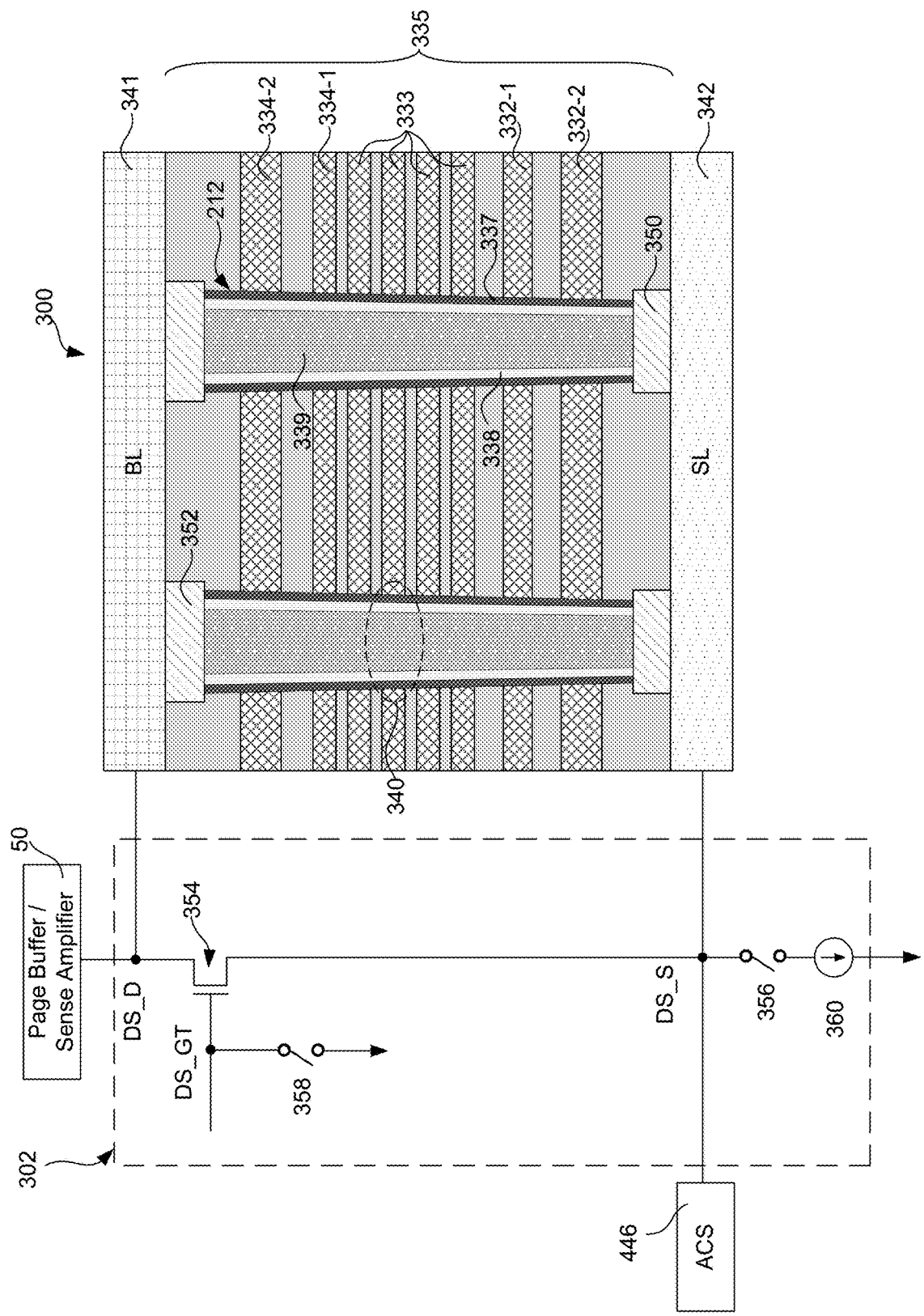
FIG. 3 illustrates a 3D NAND flash memory and a first discharge circuit, according to some embodiments of the present disclosure.

FIG. 3 illustrates a 3D NAND flash memory 300, according to some embodiments of the present disclosure. The 3D NAND flash memory 300 can be a portion of a memory block 103 in FIG. 1A. Similar to the 3D NAND flash memory 200 in FIG. 2B, the 3D NAND flash memory 300 also includes the film stack 335 of alternating conductive and dielectric layers and a plurality of memory strings 212 having a plurality of vertically stacked memory cells 340. During an erase operation, the word lines 333 for all the memory cells 340 in the same memory block can be grounded, and the erase voltage $V_{erase}$ can be applied to the bit lines 341 on top of the memory strings 212 and to a source line (SL) 342 at bottom of the memory strings. The SL 342 can be shared by all the memory strings 212 and all the memory cells 340 in the same memory block. In one example, the SL 342 can be connected to the ACS 446.

The SL 342 can be coupled to the channel layer 338 of the memory string 212 through a SL contact 350. The bit line (BL) 341 can be coupled to the channel layer 338 through a BL contact 352. In some embodiments, the SL contact 350 and the BL contact 352 comprise polycrystalline silicon. In some embodiments, the SL contact 350 and the BL contact 352 can be doped with an n-type dopant, for example, phosphine or arsenic.

The 3D NAND flash memory 300 also includes multiple select gates, for example, BSG 332-1, BSG 332-2, TSG 334-1 and TSG 334-2, where at least one select gate (e.g., BSG 332-2 and TSG 334-2) at each end of the memory string 212 can be controlled such that a GIDL current can be generated and charge carriers (e.g., holes) can be injected from the SL 342 and the BL 341 to the channel layer 338 during an erase operation. As such, electrical potential of the channel layer 338 along the memory string 212 can be raised to a voltage close to or equal to the erase voltage $V_{erase}$ applied on the SL 342 and the BL 341. As described previously, a negative voltage bias between the word line 333 and corresponding channel layer 338 can remove trapped charge carriers (e.g., electrons) in the memory film 337 and thereby reduce the threshold voltage of corresponding memory cell 340. After the erase and erase verification operation complete, i.e., after the memory cell is reset to the erase state ER, the stored data in the memory cell are erased accordingly. In this example, the erase operation can be assisted by the gate-induced-drain-leakage (GIDL) current flowing through the bit line and the source line of the memory device.

FIG. 3 also illustrates a first discharge circuit 302 for a 3D NAND flash memory, according to some embodiments of the present disclosure. The first discharge circuit 302 can be a portion of the peripheral circuit shown in FIG. 2A and can be fabricated in the peripheral region. The first discharge circuit 302 can be coupled to the 3D NAND flash memory 300 to discharge the 3D NAND flash memory 300, for example, the bit line 341 and the SL 342, after an erase operation.

The first discharge circuit 302 includes a discharge transistor 354. The discharge transistor 354 can be a metal-oxide-semiconductor field-effect-transistor (MOSFET). In some embodiments, the discharge transistor 354 can be an n-channel MOSFET. A drain terminal (DS_D) of the discharge transistor 354 can be connected to the BL 341, which can be connected to its corresponding page buffer/sense amplifier 50. A source terminal (DS_S) of the discharge transistor 354 can be connected to the SL 342, which can be connected to the ACS 446 and a current source 360 via a first switch 356. The current source 360 can be used to regulate a discharge current flowing through to ground. In some embodiments, the current source 360 can be a flexible limited current source. A gate terminal (DS_GT) of the discharge transistor 354 can be grounded via a second switch 358.

In some embodiments, the discharge transistor 354 can be included as a component in the page buffer/sense amplifier 50. In this example, each BL 341 is connected to one discharge transistor 354 at its drain terminal DS_D. All the discharge transistors 354 in the entire memory block can be connected at the source terminals DS_S to the shared SL 342. The gate terminals DS_GT of all the discharge transistors 354 in the same memory block can also be connected together to the second switch 358.

Figure 4A:
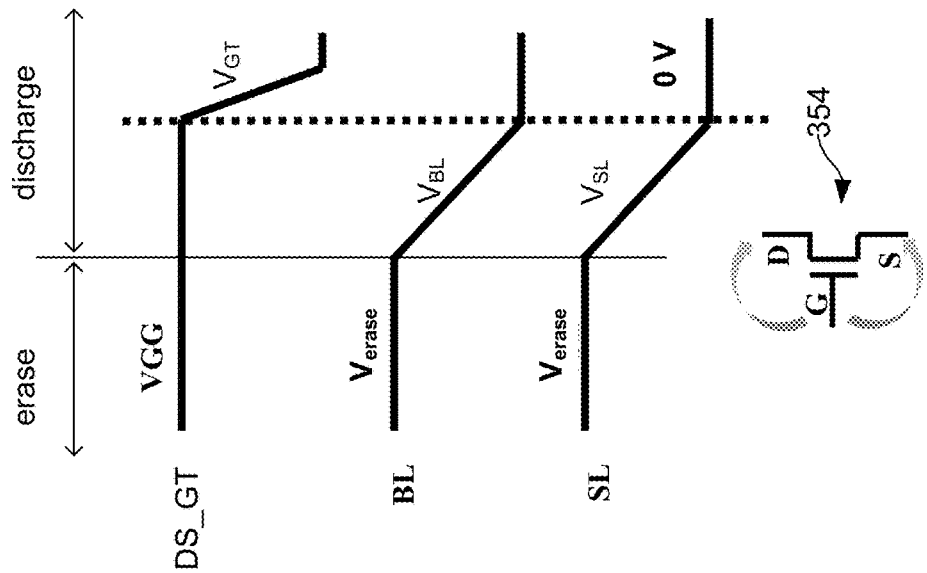
FIGS. 4A and 4B illustrate waveforms used during erase and discharge operations, according to some embodiments of the present disclosure.
Figure 4B:
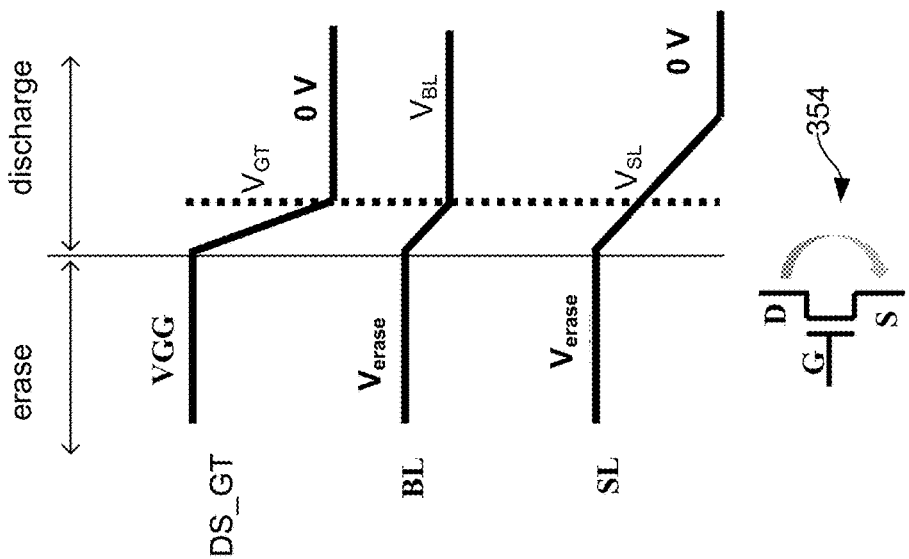

FIGS. 4A and 4B illustrate waveforms 400A and 400B used for erase and discharge operations of a 3D NAND flash memory, according to some embodiments of the present disclosure. Each erase operation is followed by the discharge operation. During the erase operation, the first switch 356 can be switched off, and the erase voltage $V_{erase}$ can be applied to the SL 342. The gate terminal DS_GT of the discharge transistor 354 can be applied with a switch-on voltage VGG to switch on the discharge transistor 354 such that the source terminal DS_S and the drain terminal DS_D of the discharge transistor 354 are electrically connected. Connected to the drain terminal DS_D of the discharge transistor 354, the BL 341 is thereby also connected to the source terminal DS_S and the SL 342, and is applied with the erase voltage $V_{erase}$. In some embodiments, the erase voltage $V_{erase}$ can be in a range between about 18 V to about 22 V. For an n-type MOSFET, to switch on the discharge transistor 354, the switch-on voltage VGG is higher than the erase voltage $V_{erase}$ applied on the source terminal DS_S. The switch-on voltage VGG can be in a range between about 22 V to about 27 V. During the erase operation and the discharge operation, word lines 333 (not shown in FIGS. 4A and 4B) can be grounded. In the example that each BL 341 is connected to one discharge transistor 354, the plurality of discharge transistors 354 can be switched on during the erase operation such that the plurality of bit lines 341 can be connected to the source line 342 during the erase operation, where the plurality of bit lines 341 and the source line 342 can be applied with the erase voltage $V_{erase}$ during the erase operation. The gate-induced-drain-leakage (GIDL) current can flow through each bit line and the source line into the channel layer of each memory string to assist the erase operation.

During the discharge operation, the first switch 356 can be switched on such that the source terminal DS_S of the discharge transistor 354 can be grounded through the current source 360, for example a flexible limited current source. The current source 360 can regulate the discharge current flowing through and thereby regulate the discharge rate of the SL 342. As shown in both waveforms 400A and 400B, at the end of the discharge operation, an electrical potential $V_{SL}$ of the SL 342 can be reduced to 0 V.

During the discharge operation, the BL 341 can be connected to the SL 342 and ground when the discharge transistor 354 is switched on. Namely, the BL 341 can be discharged simultaneously with the SL 342 through the discharge transistor 354.

At the end of the discharge operation, the discharge transistor 354 can be switched off by switching on the second switch 358 to connect the gate terminal DS_GT to ground. However, timing of switching off the discharge transistor 354 during the discharge operation can impact the performance and reliability of the discharge transistor 354.

In FIG. 4A, the second switch 358 is switched on at the same time when the first switch 356 is switched on. Because the gate terminal DS_GT is grounded when the second switch 358 is switched on, the discharge transistor 354 can be switched off. In this example, an electrical potential $V_{BL}$ of the BL 341 is still at a high level (e.g., close to the erase voltage $V_{erase}$) when the discharge transistor 354 is switched off. Because the fast discharge path through the discharge transistor 354 is turned off, the electrical potential $V_{BL}$ of the BL 341 remains at the high level, as shown in waveform 400A. Because the drain terminal DS-D of the discharge transistor 354 is connected to the BL 341, the drain terminal DS-D of the discharge transistor 354 and the BL 341 are at the same electrical potential $V_{BL}$. Therefore, after the SL 342 drops to 0 V, there is a high electrical potential difference between the drain terminal DS_D and the source terminal DS_S of the discharge transistor 354, which can cause breakdown of source/drain junctions. As the discharge transistor 354 is scaled down to a smaller dimension, a source/drain breakdown voltage of the discharge transistor 354 is decreasing. Therefore, if switching off the discharge transistor 354 too early, the high electrical potential difference between source and drain terminals can cause breakdown of the source/drain junctions of the discharge transistor 354.

In FIG. 4B, the second switch 358 is switched on when the SL 342 is dropping to 0 V. In this example, the discharge transistor 354 remains switching on when the electrical potential $V_{SL}$ of the SL 342 is decreasing from the erase voltage $V_{erase}$ to 0 V. Because the BL 341 is electrically connected to the SL 342 through the discharge transistor 354 when the discharge transistor 354 is switched on, the electrical potential $V_{BL}$ of the BL 341 follows the electrical potential $V_{SL}$ of the SL 342 and drops to 0 V at the same discharge rate. Although the source and drain of the discharge transistor 354 are at the same electrical potential in this example, there is a large voltage difference between the gate terminal DS_GT and the source/drain terminal DS_S/DS_D, which can induce Fowler-Nordheim (FN) stress to a gate dielectric of the discharge transistor 354. A threshold voltage of the discharge transistor 354 can increase accordingly, and performance and reliability of the discharge transistor 354 can decrease as a result.

Figure 5:
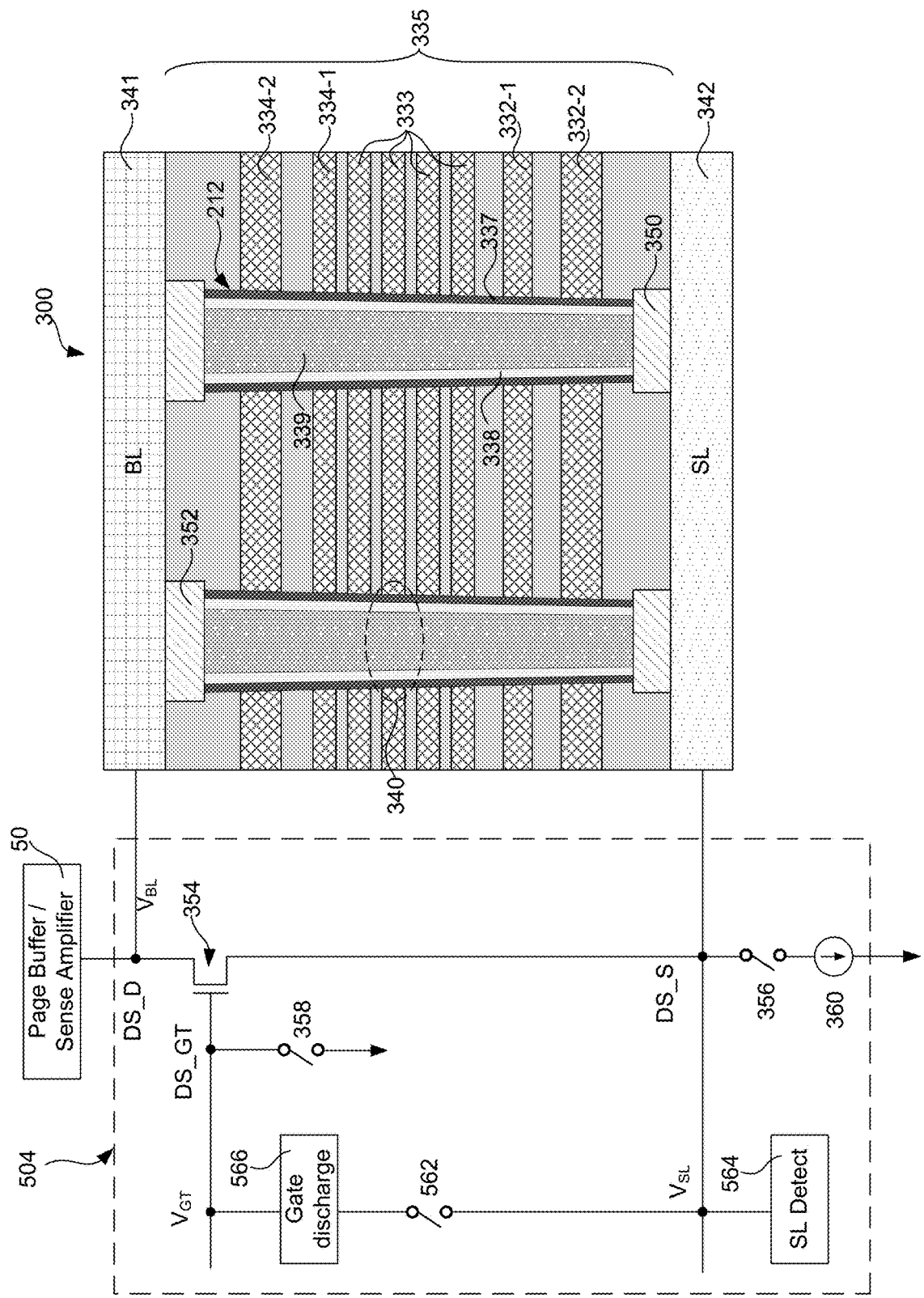
FIG. 5 illustrates a 3D NAND flash memory and a second discharge circuit, according to some embodiments of the present disclosure.

FIG. 5 illustrates a second discharge circuit 504 for a 3D NAND flash memory, according to some embodiments of the present disclosure. The second discharge circuit 504 is similar to the first discharge circuit 302, and can be coupled to the 3D NAND flash memory 300. The difference and improvement of the second discharge circuit 504 over the first discharge circuit 302 will be described in detail below.

Different from the first discharge circuit 302, the second discharge circuit 504 also includes a SL detect circuit 564, which is connected to the SL 342 and the source terminal DS_S of the discharge transistor 354. The SL detect circuit 564 is further connected to the current source 360 (e.g., a flexible limited current source) via the first switch 356.

The second discharge circuit 504 also includes a gate discharge circuit 566, which is connected to the gate terminal DS_GT of the discharge transistor 354. The gate discharge circuit 566 is also connected to the SL detect circuit 564 via a third switch 562.

Figure 6:
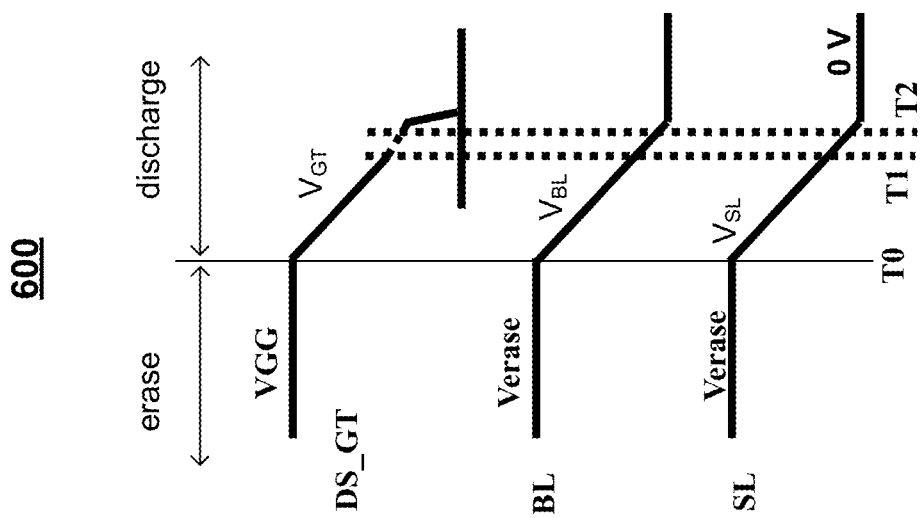
FIG. 6 illustrates a waveform used during erase and discharge operations, according to some embodiments of the present disclosure.

FIG. 6 illustrates a waveform 600 used for the second discharge circuit 504, according to some embodiments of the present disclosure. The waveform 600 depicts the erase and discharge operations performed to the 3D NAND flash memory 300 with the support from the second discharge circuit 504. The erase operation represented by the waveform 600 is also followed by the discharge operation. The erase operation of the waveform 600 is similar to waveforms 400A and 400B, as described with respect to FIGS. 4A and 4B.

During the discharge operation, timing for discharging the gate terminal DS_GT of the discharge transistor 354 can be controlled through the second discharge circuit 504 such that the discharge transistor 354 will not suffer FN stress or source/drain junction breakdown.

Figure 7:
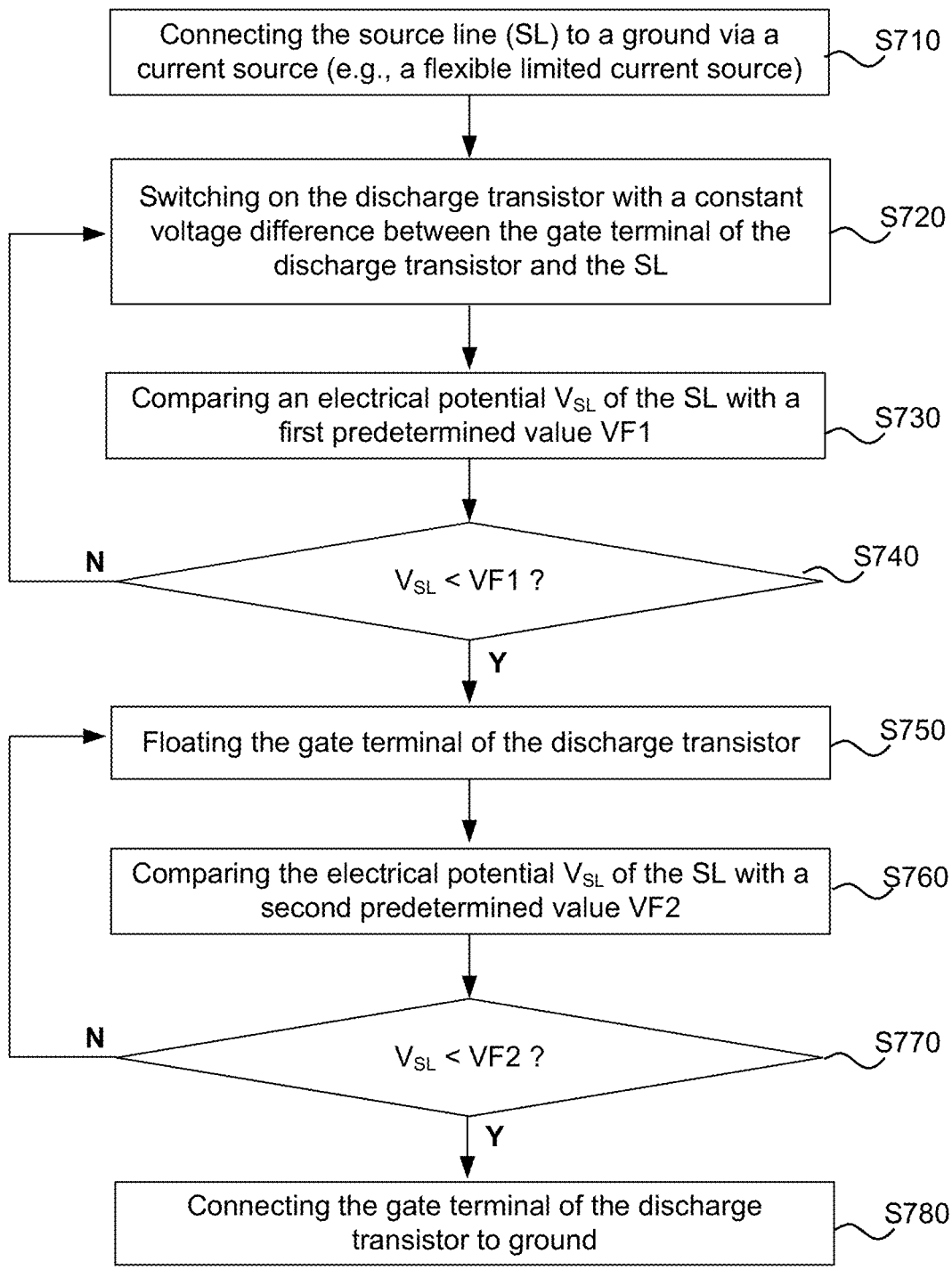
FIG. 7 illustrates a method for discharging a 3D NAND flash memory, according to some embodiments of the present disclosure.

FIG. 7 illustrates a method 700 for discharging a 3D NAND flash memory after an erase operation, according to some embodiments of the present disclosure. It should be understood that the method 700 is not exhaustive and that other operation steps can be performed as well before, after, or between any of the illustrated operation steps. In some embodiments, some operation steps of method 700 can be omitted or other operation steps can be included, which are not described here for simplicity. In some embodiments, operation steps of method 700 can be performed in a different order and/or vary.

Referring to FIGS. 5-7, the following operation steps can be implemented as an example for discharging the 3D NAND flash memory 300 through the second discharge circuit 504 after the erase operation.

First, during the erase operation and before the discharge operation, all switches, i.e., the first switch 356, the second switch 358 and the third switch 562 of the second discharge circuit 504 are switched off. The erase voltage $V_{erase}$ can be applied to the SL 342. The switch-on voltage VGG can be applied to the gate terminal DS_GT of the discharge transistor 354 to switch on the discharge transistor 354. As such, the BL 341 can be connected to the SL 342 and can also be applied with the erase voltage $V_{erase}$. At the end of the erase operation, the erase voltage $V_{erase}$ and the switch-on voltage VGG can be removed from the SL 342 and the gate terminal DS_GT, respectively.

At the beginning of the discharge operation (i.e., time T0 in FIG. 6), as shown at operation step 710, the SL 342 can be grounded by switching on the first switch 356. In the other words, a zero volt (0 V) can be applied to the SL 342. The source terminal DS_S of the discharge transistor 354 is connected to the SL 342 and thereby the source terminal DS_S of the discharge transistor 354 is kept at the same electrical potential $V_{SL}$ and is discharged simultaneously with the SL 342. The current source 360, connected between the first switch 356 and the ground, can regulate the discharge current flowing through and thereby regulate the discharge rate of the SL 342. In some embodiments, the current source 360 can be a flexible limited current source. As shown in FIG. 6, the electrical potential $V_{SL}$ of the SL 342 drops from the erase voltage $V_{erase}$ at the time T0 to 0 V at the end of the discharge operation with a slope representing its discharge rate.

The third switch 562 can be switch on at the same time as the first switch 356, i.e., at the time T0, to form an electrical connection from the gate terminal DS_GT of the discharge transistor 354 to the SL 342 through the gate discharge circuit 566. As shown in operation step S720, a constant voltage difference Vg_Vs can be provided and maintained between the gate terminal DS_GT of the discharge transistor 354 and the SL 342 by the gate discharge circuit 566. In some embodiments, the constant voltage difference Vg_Vs can be higher than the threshold voltage of the discharge transistor 354 such that the discharge transistor 354 can be switched on. In some embodiments, the constant voltage difference Vg_Vs can be in a range between about 3 V to about 10 V. In some embodiments, the constant voltage difference Vg_Vs is 5 V. To avoid causing FN stress on the discharge transistor 354, the constant voltage difference Vg_Vs can be selected to remain smaller an FN stress voltage, for example, 15 V.

Thus, at operation step S720, the BL 341 and the gate terminal DS_GT can be discharged at the same discharge rate as the SL 342. Shown in FIG. 6, an electrical potential $V_{GT}$ of the gate terminal DS_GT and the electrical potential $V_{BL}$ of the BL 341 drop from the switch-on voltage VGG and the erase voltage $V_{erase}$, respectively, at the time T0, with the same slope as the SL 342. Because the BL 341 and the SL 342 are electrically connected at about the same electrical potential, source/drain junction breakdown can also be avoided during this period.

At operation step S740, the electrical potential $V_{SL}$ of the SL 342 can be compared with a first predetermined value VF1 by the SL detect circuit 564. In some embodiments, to reduce distress to the gate dielectric of the discharge transistor 354, the first predetermined value VF1 can be selected in a range between, for example, 3V and 5V.

At operation step S740, it is determined whether the electrical potential $V_{SL}$ of the SL 342 is smaller or lower than the first predetermined value VF1. If the electrical potential $V_{SL}$ of the SL 342 is not lower than the first predetermined value VF1, the operation steps S720 and S730 can be repeated.

When the electrical potential $V_{SL}$ of the SL 342 falls below the first predetermined value VF1, for example, at time T1, the third switch 562 can be switched off according to operation step S750. As a result, the gate terminal DS_GT of the discharge transistor 354 can be floating. Namely, there is no external bias applied on the gate terminal DS_GT. Due to capacitive coupling effect, the electrical potential $V_{GT}$ of the gate terminal DS_GT follows the electrical potential $V_{SL}$ of the SL 342. The gate terminal DS_GT continues discharging, but at a discharge rate slower than the SL 342. In the meantime, the discharge transistor 354 remains switched-on such that the BL 341 can continue to be discharged through the discharge transistor 354.

At operation step S760, the electrical potential $V_{SL}$ of the SL 342 can be compared with a second predetermined value VF2 by the SL detect circuit 564.

At operation step S770, it is determined whether the electrical potential $V_{SL}$ of the SL 342 is smaller or lower than the second predetermined value VF2. If the electrical potential $V_{SL}$ of the SL 342 is not lower than the second predetermined value VF2, the operation steps S750 and S760 can be repeated.

When the electrical potential $V_{SL}$ of the SL 342 falls below the second predetermined value VF2, for example, at time T2, the second switch 358 can be switched on according to operation step S780. As a result, the gate terminal DS_GT is grounded, i.e., is applied with 0V. The gate terminal DS_GT can thus be quickly discharged to 0V. The discharge transistor 354 is switched off accordingly.

The second predetermined value VF2 can be smaller than the first predetermined valve VF1. In some embodiments, to avoid source/drain junction breakdown, the second predetermined value VF2 can be selected to below a source/drain junction breakdown voltage. In some embodiments, the second predetermined value VF2 can be between 0.5V and 3V, for example, e.g. the second predetermined value VF2 can be 1V or 2V. Therefore, even after the discharge transistor 354 is switched off, without a quick discharge path, the electrical potential $V_{BL}$ of the BL 341 can be controlled to below the source/drain junction breakdown voltage.

At the end of the discharge operation, the first, second and third switches 356/358/562 in the second discharge circuit 504 can be switched off.

Figure 8B:
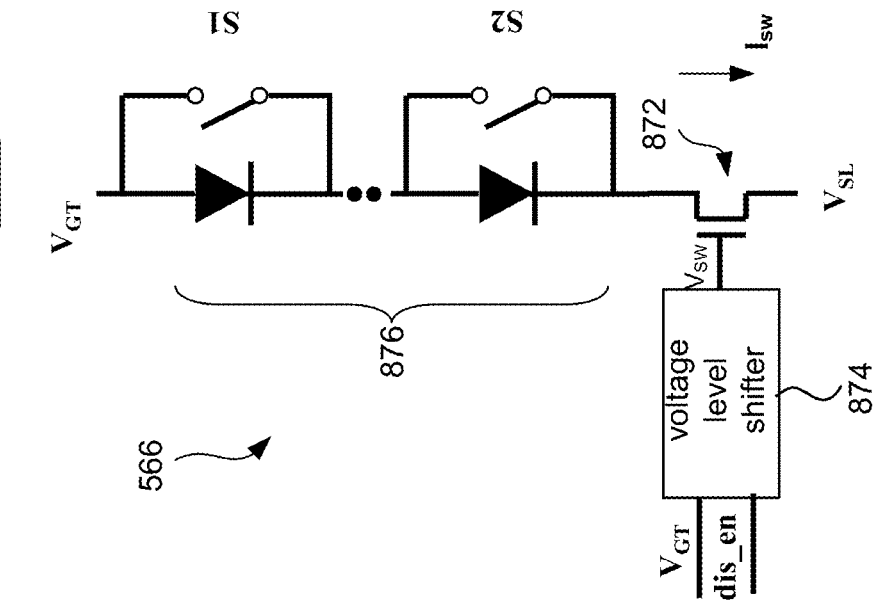
FIGS. 8A and 8B illustrate schematic diagrams of a gate discharge circuit, according to some embodiments of the present disclosure.
Figure 8A:
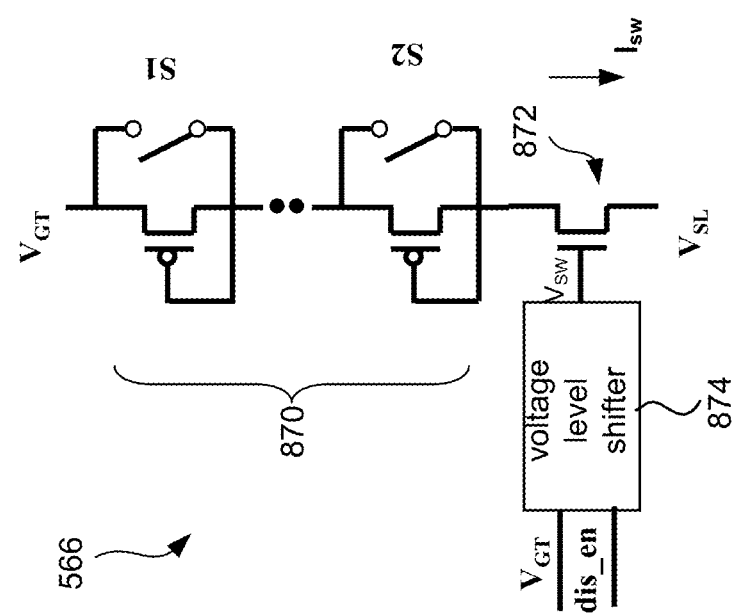

FIGS. 8A and 8B illustrate schematic diagrams 800A and 800B of the gate discharge circuit 566, according to some embodiments of the present disclosure. As described previously, the gate discharge circuit 566 can maintain the constant voltage different Vg_Vs between the electrical potential $V_{GT}$ of the gate terminal DS_GT and the electrical potential $V_{SL}$ of the SL 342 shown in FIG. 5. The gate discharge circuit 566 can be designed in the peripheral circuit of a 3D NAND flash memory.

In FIGS. 8A and 8B, the gate discharge circuit 566 includes a switch transistor 872 and a voltage level shifter 874. A source terminal of the switch transistor 872 can be connected to the SL 342 (not shown in FIG. 8A) at the electrical potential $V_{SL}$. As shown in FIG. 5, the third switch 562 can be inserted between the SL 342 and the gate discharge circuit 566. In some embodiments, the switch transistor 872 can be implemented as the third switch 562. In some embodiments, the switch transistor 872 can be implemented in addition to the third switch 562. The switch transistor 872 can be switched on or off through the voltage level shifter 874 connected to a gate terminal of the switch transistor 872. The voltage level shifter 874 can transform the electrical potential $V_{GT}$ at the gate terminal DS_GT of the discharge transistor 354 to a switching voltage $V_{SW}$ for switching on the switch transistor 872. The voltage level shifter 874 can also be controlled by an enablement signal dis_en to determine when the switching voltage $V_{SW}$ can be provided to the switching transistor 872. A switching current $I_{SW}$ flowing through the switching transistor 872 can be determined by the switching voltage $V_{SW}$.

In FIG. 8A, the gate discharge circuit 566 also includes a set of MOSFETs 870 connected in series. A first end of the set of MOSFETs 870 can be connected to a drain terminal of the switching transistor 872 and a second end of the set of MOSFETs 870 can be connected to the gate terminal DS_GT of the discharge transistor 354 at the electrical potential $V_{GT}$. Each of the set of MOSFETs 870 can be configured as an effective diode—a gate terminal can be connected to a drain terminal. As such, each of the set of MOSFETs can operation in its saturation mode. A voltage drop across each of the set of MOSFETs 870 depends on the switching current $I_{SW}$ which is controlled by the switching transistor 872. A total voltage drop across the set of MOSFETs 870 from the first end to the second end can determine the constant voltage difference Vg_Vs between the electrical potentials $V_{GT}$ and $V_{SL}$. In addition, each of the set of MOSFETs 870 can be bypassed by a parallel switch (e.g, switch S1, S2, . . . ) such that the constant voltage difference Vg_Vs between the electrical potentials $V_{GT}$ and $V_{SL}$ can be adjusted.

The set of MOSFETs 870 can include p-channel MOSFETs or n-channel MOSFETs.

In FIG. 8A, p-channel MOSFETs are illustrated as an example. To reduce body-bias effect, it is preferred that a body of each MOSFET can be tied to a source terminal of the MOSFET. Since the body of a p-channel MOSFET is in an n-well and can be tied to its source terminal easily, it is preferred that p-channel MOSFETs can be used in the set of MOSFETs 870 instead of n-channel MOSFETs.

In FIG. 8B, the gate discharge circuit 566 can also include a set of diodes 876 connected in series. A first end of the set of diodes 876 can be connected to the drain terminal of the switching transistor 872, and a second end of the set of diodes 876 can be connected to the gate terminal DS_GT of the discharge transistor 354 at the electrical potential $V_{GT}$. A voltage drop across each of the set of diodes 876 depends on the switching current $I_{SW}$ that is controlled by the switching transistor 872. A total voltage drop across the set of diodes 876 from its first end to the second end can determine the constant voltage difference Vg_Vs between the electrical potentials $V_{GT}$ and $V_{SL}$. In addition, each of the set of diodes 876 can also be bypassed by the parallel switch (e.g, switch S1, S2, . . . ) such that the constant voltage difference Vg_Vs between the electrical potentials $V_{GT}$ and $V_{SL}$ can be adjusted. However, because a diode usually occupies larger area than a MOSFET, to reduce cost, it is preferred that p-channel MOSFETs can be used for the gate discharge circuit 566 instead of diodes.

Figure 9:
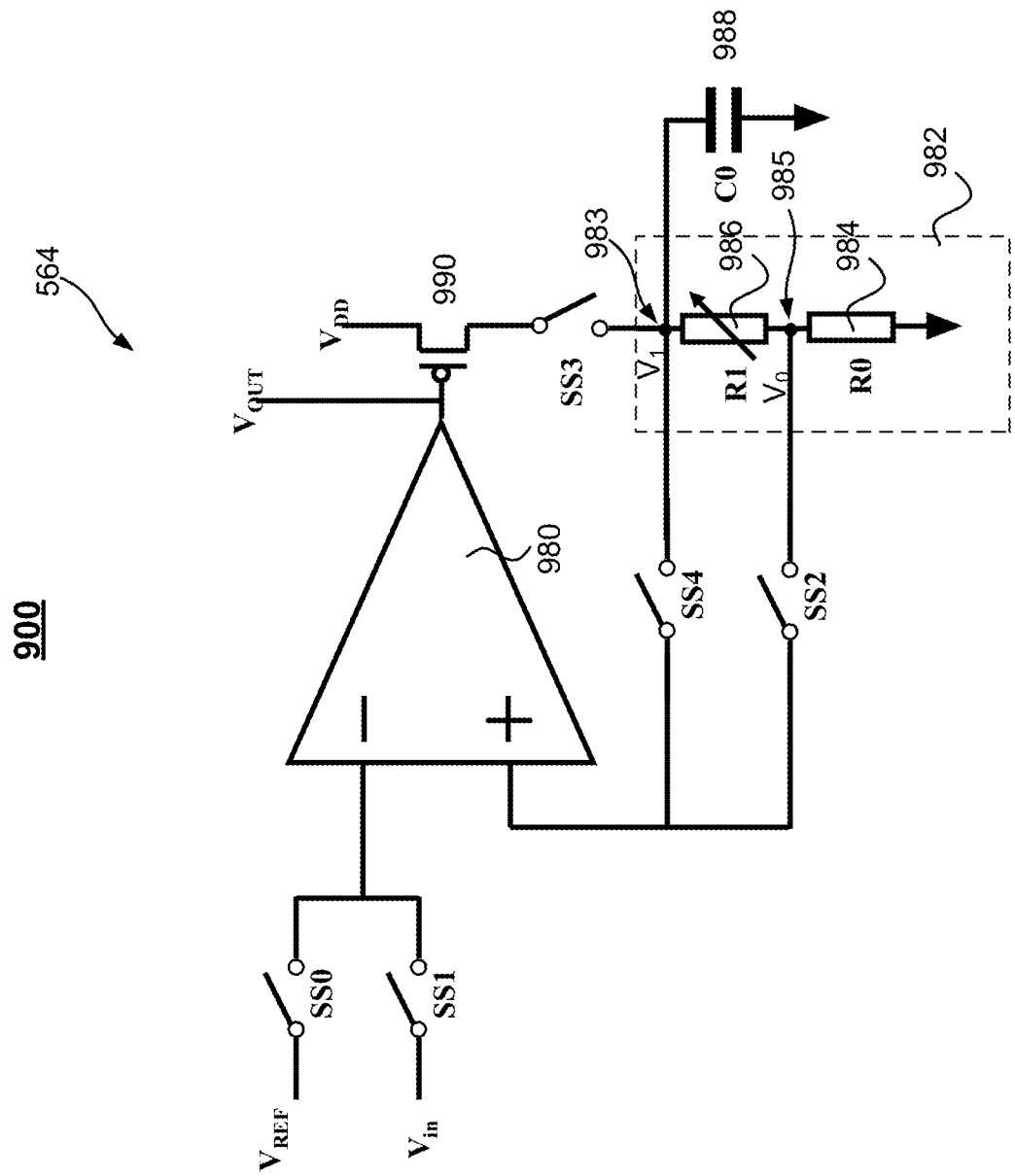
FIG. 9 illustrates a schematic diagram of a source line (SL) detect circuit, according to some embodiments of the present disclosure.

FIG. 9 illustrates a schematic diagram 900 of the SL detect circuit 564, according to some embodiments of the present disclosure. As discussed previously, the SL detect circuit 564 can compare the electrical potential $V_{SL}$ of the SL 342 with a predetermined value (e.g., the first predetermined value VF1 or the second predetermined value VF2).

The SL detect circuit 564 includes an operational amplifier 980, which has a negative input and a positive input. The negative input of the operational amplifier 980 can be connected to a reference voltage $V_{REF}$ or a input voltage $V_{IN}$. Switches SS0 and SS1 can be used to select the reference voltage $V_{REF}$ or the input voltage $V_{IN}$. In some embodiments, the operational amplifier 980 is a comparator.

The SL detect circuit 564 also includes a resistive voltage divider 982 that has a first resistor 984 connected in series with a second resistor 986. The first resistor 984 has a resistance R0 and the second resistor 986 has a resistance R1 that can be adjusted. In some embodiments, the second resistor 986 is a potentiometer. The resistive voltage divider 982 is connected in parallel with a capacitor 988, where first ends 983 of the resistive voltage divider 982 and the capacitor 988 are connected together to the positive input of the operational amplifier 980 via a switch SS4. Second ends of the resistive voltage divider 982 and the capacitor 988 are both grounded. The capacitor 988 has a capacitance Co. An intermediate point 985 between the first resistor 984 and the second resistor 986 is connected to the positive input of the operational amplifier 980 via a switch SS2.

As shown in FIG. 9, the SL detect circuit 564 also includes a pull-up transistor 990. In some embodiments, the pull-up transistor 990 is a p-channel MOSFET, where a drain terminal of the pull-up transistor 990 is connected to the first ends of the resistive voltage divider 982 and the capacitor 988 via a switch SS3, and a source terminal of the pull-up transistor 990 is connected to a power supply $V_{DD}$. A gate terminal of the pull-up transistor 990 is connected to an output of the comparator with an output voltage $V_{OUT}$.

Initially, the predetermined value (e.g., the first predetermined value VF1 and the second predetermined value VF2) used in the method 700 for the discharge operation can be set to the SL detect circuit 564. Next, the input voltage $V_{IN}$, e.g., the electrical potential $V_{SL}$ of the SL 342, can be compared with the first predetermined value VF1 and then the second predetermined value VF2.

Figure 10:
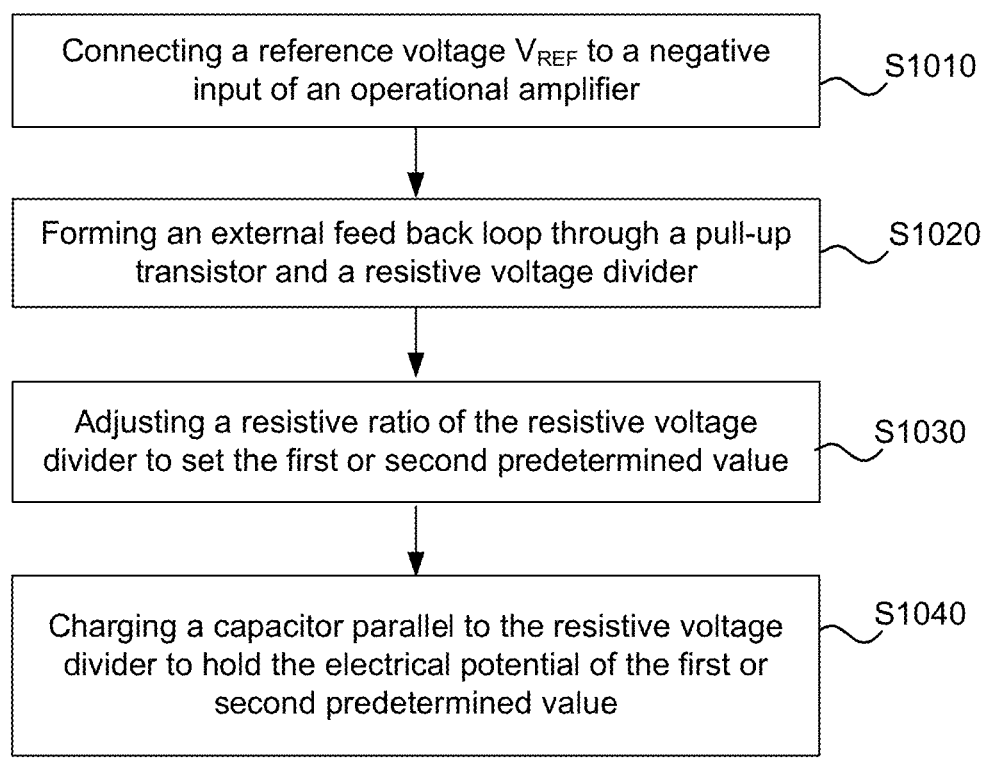
FIG. 10 illustrates a method to set a predetermined value for a SL detect circuit, according to some embodiments of the present disclosure.

FIG. 10 illustrates a method 1000 to set the predetermined value (e.g., the first predetermined value VF1 or the second predetermined value VF2) to the SL detect circuit 564, according to some embodiments of the present disclosure. It should be understood that the method 1000 is not exhaustive and that other operation steps can be performed as well before, after, or between any of the illustrated operation steps. In some embodiments, some operation steps of method 1000 can be omitted or other operation steps can be included, which are not described here for simplicity. In some embodiments, operation steps of method 1000 can be performed in a different order and/or vary.

Referring to FIGS. 9 and 10, at operation step 1010, the switch SS0 can be switched on, and the switch SS1 can be switched off. As a result, the negative input of the operational amplifier 980 is at the reference voltage $V_{REF}$.

At operation step 1020, the switches SS2 and SS3 can be switched on, and the switch SS4 can be switched off. As a result, the positive input of the operational amplifier 980 is connected to the intermediate point 985 of the resistive voltage divider 982, which is at an electrical potential $V_0$. An external feedback loop is formed from the output of the operational amplifier 980 through the pull-up transistor 990 and the resistive voltage divider 982 to the positive input of the operational amplifier 980. Due to a high gain of an operational amplifier, the voltage difference between the positive and negative inputs can be about zero. Accordingly, the electrical potential $V_0$ at the intermediate point 985 can be set to the reference voltage $V_{REF}$, i.e., $V_0 = V_{REF}$.

At operation step 1030, through the resistive voltage divider 982 and the pull-down transistor 990, an electrical potential $V_1$ at the first ends 983 of the resistive voltage divider 982 and the capacitor 988 can be determined as $$V_1 = V_0 * \left(1 + \frac{R1}{R0}\right) = V_{REF} * \left(1 + \frac{R1}{R0}\right).$$

As such, by adjusting the resistance R1 of the second resistor 986, or a resistive ratio between the resistances R1 and R0, the electrical potential $V_1$ can be set to the predetermined value, for example, the first predetermined value VF1 or the second predetermined value VF2.

At operation step 1040, the capacitor 988, connected in parallel with the resistive voltage divider 982, is charged to the electrical potential V1 through the pull-up transistor 990 and the power supply $V_{DD}$. Accordingly, the electrical potential V1, i.e., the first predetermined value VF1 or the second predetermined value VF2, can be held by the capacitor 988 once the power supper $V_{DD}$ is disconnected.

As described above, in the method 1000, the operational amplifier 980 is configured as a voltage buffer, where an input voltage can be mirrored or followed at an output.

Figure 11:
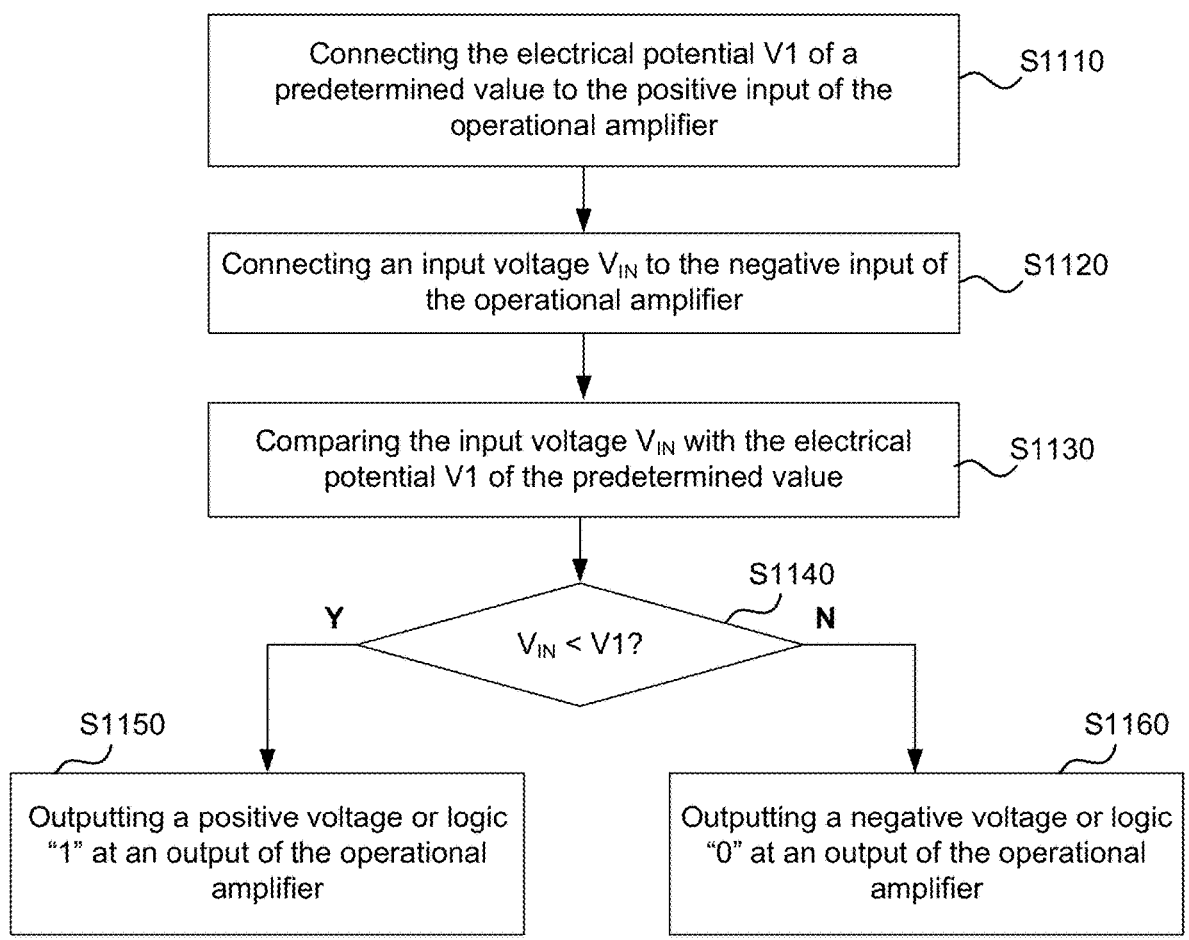
FIG. 11 illustrates a method to compare an input voltage with a predetermined value, according to some embodiments of the present disclosure.

FIG. 11 illustrates a method 1100 to compare the input voltage $V_{IN}$ (e.g., the electrical potential $V_{SL}$ of the SL 342) with the predetermined value (i.e., the electrical potential V1, e.g., the first predetermined value VF1 or the second predetermined value VF2), according to some embodiments of the present disclosure. It should be understood that the method 1100 is not exhaustive and that other operation steps can be performed as well before, after, or between any of the illustrated operation steps. In some embodiments, some operation steps of method 1100 can be omitted or other operation steps can be included, which are not described here for simplicity. In some embodiments, operation steps of method 1100 can be performed in a different order and/or vary.

Referring to FIGS. 9 and 11, at operation step 1110, the switches SS2 and SS3 can be switched off, and the switches SS4 can be switched on. After the power supply $V_{DD}$ is disconnected from the resistive voltage divider 982 and the capacitor 988, the electrical potential V1 (e.g., the first predetermined value VF1 or the second predetermined value VF2), held by the capacitor 988, can be connected to the positive input of the operational amplifier 980.

At operation step 1120, the switch SS0 can be switched off and the switch SS1 can be switched on. Accordingly, the input voltage $V_{IN}$ can be connected to the negative input of the operational amplifier 980.

At operation step 1130, the input voltage $V_{IN}$ can be compared with the electrical potential V1 by the operational amplifier 980. Here, the operational amplifier 980 is configured as a comparator, where voltages at its two inputs can be compared.

At operation step 1140, it is determined whether the input voltage $V_{IN}$ is lower than the electrical potential V1 or not.

At operation step 1150, when the input voltage $V_{IN}$ is lower than the electrical potential V1 (e.g., the first predetermined value VF1 or the second predetermined value VF2), the output voltage $V_{OUT}$ can be positive or logic "1."

At operation step 1160, when the input voltage $V_{IN}$ is higher than the electrical potential V1 (e.g., the first predetermined value VF1 or the second predetermined value VF2), the output voltage can be negative or logic "0."

As described above, by adding the gate discharge circuit 566 to provide the constant voltage difference Vg_Vs between the gate terminal DS_GT of the discharge transistor 354 and the SL 342, and by introducing the SL detect circuit 564 to compare the electrical potential $V_{SL}$ of the SL 342 with the first predetermined value VF1 and the second predetermined value VF2, the discharge operation for the 3D NAND flash memory can be optimized. First, the discharge transistor 354 remains switched on to discharge the BL 342. By maintaining the constant voltage different Vg_Vs between the gate terminal DS_GT of the discharge transistor 354 and the SL 342, a high voltage difference between the source terminal DS_S and the drain terminal DS_D can be avoided. Thus, source/drain junction breakdown of the discharge transistor 354 can be avoided. The constant voltage difference Vg_Vs can also be used to avoid causing FN stress to the gate dielectric of the discharge transistor 354. Second, when discharging the gate terminal DS_S of the discharging transistor 354, source/drain junction breakdown or FN stress can also be avoided by comparing the electrical potential $V_{SL}$ of the SL 342 with the first predetermined value VF1 and the second predetermined value VF2.

It is noted that the discharging methods and circuits described in the present disclosure are not limited to a three-dimensional NAND flash memory or a NAND flash memory. Any system having a discharge operation can adapt the methods and circuits described above to achieve improved performance and reliability.

In summary, the present disclosure provides a discharge circuit for discharging a memory device after an erase operation. The discharge circuit includes a discharge transistor, connecting a bit line and a source line of the memory device. The discharge circuit also includes a source line detect circuit, connected to the source line and configured to compare an electrical potential of the source line with a predetermined value. The discharge circuit further includes a gate discharge circuit, configured to maintain a constant voltage difference between the discharge transistor and the source line, wherein the constant voltage difference applied to the discharge transistor and the source line switches on the discharge transistor.

The present disclosure also provides a method for discharging a memory device after an erase operation. The method comprises grounding a source line of the memory device; and switching on a discharge transistor to connect a bit line of the memory device to the source line by maintaining a constant voltage difference between a gate terminal of the discharge transistor and the source line. The method also includes comparing an electrical potential of the source line with a first predetermined value; and floating the gate terminal of the discharge transistor when the electrical potential of the source line is lower than the first predetermined value.

The present disclosure further provides a memory device having a memory block and a peripheral circuit. The memory block includes a plurality of memory strings connected to a source line and a plurality of bit lines. The peripheral circuit includes a discharge circuit configured to discharge the memory block after an erase operation. The discharge circuit includes a plurality of discharge transistors. Each discharge transistor is configured to connect the source line to a corresponding bit line. The discharge circuit also includes a source line detect circuit connected to the source line and configured to compare an electrical potential of the source line with a predetermined value. The discharge circuit further includes a gate discharge circuit, configured to maintain a constant voltage difference between gate terminals of the plurality of discharge transistors and the source line.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A discharge circuit for discharging a memory device after an erase operation, comprising:
a discharge transistor, connecting a bit line and a source line of the memory device;
a source line detector circuit, connected to the source line and configured to compare an electrical potential of the source line with a predetermined value; and
a gate discharge circuit, configured to maintain a constant voltage difference between the discharge transistor and the source line, wherein the constant voltage difference applied to the discharge transistor and the source line switches on the discharge transistor.

2. The discharge circuit of claim 1, wherein the discharge transistor is a metal-oxide-semiconductor field-effect-transistor (MOSFET), a gate terminal of the MOSFET connected to the gate discharge circuit, a source terminal of the MOSFET is connected to the source line and a drain terminal of the MOSFET is connected to the bit line.

3. The discharge circuit of claim 1, wherein the gate discharge circuit comprises a set of diodes connected in series.

4. The discharge circuit of claim 3, wherein each diode of the set of diodes is connected in parallel with a switch such that the constant voltage difference is adjustable.

5. The discharge circuit of claim 3, wherein the gate discharge circuit further comprises a switching transistor connected in series with the set of diodes.

6. The discharge circuit of claim 5, wherein the gate discharge circuit further comprises a voltage level shifter configured to provide a switching voltage to switch on the switching transistor.

7. The discharge circuit of claim 3, wherein the set of diodes comprise a MOSFET configured as an effective diode, wherein a gate terminal of the MOSFET is connected to a drain terminal of the MOSFET.

8. The discharge circuit of claim 7, wherein the MOSFET is a p-channel MOSFET.

9. The discharge circuit of claim 1, wherein the source line detector circuit comprises:
an operational amplifier;
a resistive voltage divider; and
a capacitor connected in parallel with the resistive voltage divider, wherein:
first ends of the capacitor and the resistive voltage divider are connected; and
second ends of the capacitor and the resistive voltage divider are grounded.

10. The discharge circuit of claim 9, wherein the source line detector circuit further comprises a pull-up transistor connecting the first ends of the capacitor and the resistive voltage divider to a power supply, and wherein the pull-up transistor is controlled by an output of the operational amplifier.

11. The discharge circuit of claim 9, wherein the resistive voltage divider comprises a first resistor connected in series with a second resistor, the second resistor comprising an adjustable resistance.

12. The discharge circuit of claim 9, wherein the operational amplifier is configured to set the predetermined value through an electrical potential of the first ends of the capacitor and the resistive voltage divider, wherein:
a negative input of the operational amplifier is connected to a reference voltage; and
a positive input of the operational amplifier is connected to an intermediate point of the resistive voltage divider.

13. The discharge circuit of claim 9, wherein the operational amplifier is configured to compare the electrical potential of the source line with the predetermined value, wherein:
a negative input of the operational amplifier is connected to the source line; and
a positive input of the operational amplifier is connected to the first ends of the capacitor and the resistive voltage divider.

14. The discharge circuit of claim 1, wherein the source line is grounded.

15. The discharge circuit of claim 14, further comprising:
a current source configured to regulate a discharge current flowing through the source line.

16. A method for discharging a memory device after an erase operation, comprising:
grounding a source line of the memory device;
switching on a discharge transistor to connect a bit line of the memory device to the source line by maintaining a constant voltage difference between a gate terminal of the discharge transistor and the source line;
comparing an electrical potential of the source line with a first predetermined value; and floating the gate terminal of the discharge transistor when the electrical potential of the source line is lower than the first predetermined value.

17. The method of claim 16, further comprising:
comparing the electrical potential of the source line with a second predetermined value, wherein the second predetermined value is smaller than the first predetermined value.

18. The method of claim 17, further comprising:
grounding the gate terminal of the discharge transistor when the electrical potential of the source line is lower than the second predetermined value.

19. The method of claim 16, wherein the erase operation is assisted by a gate-induced-drain-leakage (GIDL) current flowing through the bit line and the source line of the memory device.

20. A memory device, comprising:
a memory block, comprising a plurality of memory strings connected to a source line and a plurality of bit lines; and a peripheral circuit, comprising:
a discharge circuit configured to discharge the memory block after an erase operation, the discharge circuit comprising:
a plurality of discharge transistors, wherein each discharge transistor of the plurality of discharge transistors is configured to connect the source line to a corresponding bit line;
a source line detector circuit connected to the source line and configured to compare an electrical potential of the source line with a predetermined value; and
a gate discharge circuit, configured to maintain a constant voltage difference between gate terminals of the plurality of discharge transistors and the source line.

\* \* \* \* \*